United States Patent
Wang et al.

(10) Patent No.: US 11,251,311 B2
(45) Date of Patent: Feb. 15, 2022

(54) THIN-FILM TRANSISTOR, METHOD OF MANUFACTURING THE SAME, AND DISPLAY APPARATUS

(71) Applicant: BOE Technology Group Co., Ltd., Beijing (CN)

(72) Inventors: Guoying Wang, Beijing (CN); Zhen Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 795 days.

(21) Appl. No.: 16/075,268

(22) PCT Filed: Jan. 23, 2018

(86) PCT No.: PCT/CN2018/073806
§ 371 (c)(1),
(2) Date: Aug. 3, 2018

(87) PCT Pub. No.: WO2018/201758
PCT Pub. Date: Nov. 8, 2018

(65) Prior Publication Data
US 2021/0202757 A1    Jul. 1, 2021

(30) Foreign Application Priority Data
May 4, 2017  (CN) .......................... 201710309534.6

(51) Int. Cl.
*H01L 29/786* (2006.01)
*H01L 29/40* (2006.01)
*H01L 29/66* (2006.01)

(52) U.S. Cl.
CPC ...... *H01L 29/78696* (2013.01); *H01L 29/401* (2013.01); *H01L 29/6675* (2013.01);
(Continued)

(58) Field of Classification Search
CPC ......... H01L 29/78696; H01L 29/66969; H01L 29/6675; H01L 29/401; H01L 29/78693;
(Continued)

(56) References Cited

U.S. PATENT DOCUMENTS 5,670,398 A * 9/1997 Yin ................... H01L 29/78696
                                              438/151
5,883,399 A    3/1999 Yin et al.
(Continued)

FOREIGN PATENT DOCUMENTS

CN       1133495 A      10/1996
CN     102064089 A       5/2011
(Continued)

OTHER PUBLICATIONS

First office action of Chinese application No. 201710309534.6 dated Jun. 17, 2019.
(Continued)

*Primary Examiner* — Jonathan Han
(74) *Attorney, Agent, or Firm* — Fay Sharpe LLP

(57) ABSTRACT

A thin-film transistor, method of manufacturing the same, and a display apparatus are provided. The thin-film transistor includes a first active layer, a source, a drain, a gate, and a second active layer, the source, the drain, the gate are disposed on the first active layer with spacing, the gate is located between the source and the drain, the second active layer is disposed on the gate, the source, and the drain, the source and the drain are both respectively connected to the first active layer and the second active layer, and the gate is respectively insulated from the first active layer, the second active layer, the source, and the drain. When a voltage is applied to the gate, the source and the drain may be conducting via the first and second active layer. Therefore, a larger current may flow between the source and the drain.

11 Claims, 19 Drawing Sheets

(52) U.S. Cl.
CPC .. *H01L 29/66969* (2013.01); *H01L 29/78663* (2013.01); *H01L 29/78672* (2013.01); *H01L 29/78693* (2013.01)

(58) Field of Classification Search
CPC ......... H01L 29/78672; H01L 29/78663; H01L 29/7869; H01L 29/1033; H01L 29/66742; H01L 29/786
USPC .......................................................... 257/43
See application file for complete search history.

(56) References Cited

U.S. PATENT DOCUMENTS

| | | | |
|---|---|---|---|
| 7,419,858 B2* | 9/2008 | Schuele | H01L 29/66621 257/E21.413 |
| 10,020,402 B2* | 7/2018 | Ku | H01L 29/78609 |
| 2006/0220085 A1* | 10/2006 | Huo | H01L 29/78648 257/296 |
| 2007/0075362 A1* | 4/2007 | Wu | H01L 29/7813 257/335 |
| 2007/0295976 A1* | 12/2007 | Katou | H01L 29/78621 257/93 |
| 2011/0114961 A1 | 5/2011 | Lee et al. | |
| 2016/0190328 A1* | 6/2016 | Yang | H01L 29/41733 349/46 |
| 2017/0141231 A1* | 5/2017 | Matsumoto | H01L 21/383 |

FOREIGN PATENT DOCUMENTS

| | | |
|---|---|---|
| CN | 102184968 A | 9/2011 |
| CN | 103474470 A | 12/2013 |
| CN | 106935657 A | 7/2017 |

OTHER PUBLICATIONS

International Search Report dated Apr. 25, 2018 in PCT/CN2018/073806 (untranslated).

* cited by examiner

THIN-FILM TRANSISTOR, METHOD OF MANUFACTURING THE SAME, AND DISPLAY APPARATUS

This application is a 371 of International Application No. PCT/CN2018/073806, filed on Jan. 23, 2018, which claims priority to Chinese Patent Application No. 201710309534.6, filed with the State Intellectual Property Office on May 4, 2017 and titled "THIN-FILM TRANSISTOR, METHOD OF MANUFACTURING THE SAME, AND DISPLAY APPARATUS", the entire contents of which are incorporated herein by reference.

TECHNICAL FIELD

The present disclosure relates to, but is not limited to a thin-film transistor, method of manufacturing the same, and a display apparatus.

BACKGROUND

Currently, common display apparatuses comprise two major types: passive light emitting display apparatuses (for example, liquid crystal display apparatuses) and active light emitting display apparatuses (for example, organic light emitting diode (OLED) display apparatuses). A backlight does not need to be disposed in an active light emitting display apparatus. Compared with a passive light emitting display apparatus, an active light emitting display apparatus has advantages such as small thickness, low power consumption, and fast response speed. Therefore, active light emitting display apparatuses have higher market competitiveness.

An OLED display apparatus comprises a plurality of OLEDs. Each OLED is connected to one thin-film transistor. The on/off of the OLED can be controlled by controlling the on/off of the thin-film transistor. The brightness of the OLED can be adjusted by adjusting the magnitude of the on-state current (that is, a current generated when the thin-film transistor is turned on in a forward direction) of the thin-film transistor.

To obtain a larger on-state current, the area of an active layer is usually increased in an existing thin-film transistor.

SUMMARY

At least one embodiment of the present disclosure provides a thin-film transistor, method of manufacturing the same, and a display apparatus.

At least one embodiment of the present disclosure provides a thin-film transistor, comprising a first active layer, a source, a drain, a gate, and a second active layer, wherein the source, the drain, and the gate are disposed on the first active layer with spacing, the gate is located between the source and the drain, the second active layer is disposed on the gate, the source, and the drain, the source and the drain are both respectively connected to the first active layer and the second active layer, and the gate is respectively insulated from the first active layer, the second active layer, the source, and the drain.

Optionally, the thin-film transistor further comprises an insulating layer, and the insulating layer wraps the gate.

Optionally, the insulating layer comprises a first gate insulating layer and a second gate insulating layer, the first gate insulating layer is disposed on the first active layer, the first gate insulating layer is located between the source and the drain, a groove is provided on the first gate insulating layer, the gate is disposed in the groove, the second gate insulating layer is disposed on the gate, and the second gate insulating layer is disposed between the source and the drain.

Optionally, at least one of the first gate insulating layer and the second gate insulating layer is formed of a metal oxide.

Optionally, the second active layer is connected to the first active layer.

Further, the source and the drain are wrapped in the first active layer and the second active layer.

Optionally, the first active layer is made of a silicon-based material or a zinc-oxide-based material, and the second active layer is made of a silicon-based material or a zinc-oxide-based material.

Optionally, the thickness of the first active layer is 30 nm to 70 nm, and the thickness of the second active layer is 30 nm to 70 nm.

Optionally, the thickness of the source is 200 nm to 400 nm, the thickness of the drain is 200 nm to 400 nm, and the thickness of the gate is 100 nm to 200 nm.

Optionally, an orthographic projection of the gate on the first active layer and orthographic projections of the source and the drain on the first active layer do not overlap.

At least one embodiment of the present disclosure provides a method of manufacturing a thin-film transistor, wherein the manufacturing method comprises:

forming a first active layer, a source, a drain, and a gate on a substrate, the source, the drain, and the gate being disposed on the first active layer with spacing, and the gate being located between the source and the drain in a direction parallel to the substrate; and forming a second active layer on the gate, the source, and the drain, wherein the source and the drain are both connected to the first active layer and the second active layer, and the gate is respectively insulated from the first active layer, the second active layer, the source, and the drain.

Optionally, forming a first active layer, a source, a drain, and a gate on a substrate comprises:

sequentially forming the first active layer and a source-drain metal layer on the substrate, and forming a groove on the source-drain metal layer, the depth of the groove being less than the thickness of the source-drain metal layer;

performing oxidation treatment on the groove bottom and side walls of the groove to form the source, the drain, and a first gate insulating layer, the first gate insulating layer separating the source and the drain;

forming the gate in the groove; and forming a second gate insulating layer on the gate, the second gate insulating layer being located between the source and the drain.

Optionally, forming a first active layer, a source, a drain, and a gate on a substrate comprises:

sequentially forming the first active layer and a first gate insulating layer on the substrate, the first gate insulating layer being located on the first active layer, and a groove being opened on the first gate insulating layer;

forming an electrode material film layer on the first active layer and the first gate insulating layer;

performing patterning treatment on the electrode material film layer to form the source and the drain on the first active layer and form the gate in the groove, the first gate insulating layer being located between the source and the drain in a direction parallel to the substrate; and forming a second gate insulating layer on the gate, the second gate insulating layer being located between the source and the drain.

Optionally, forming a first active layer, a source, a drain, and a gate on a substrate comprises:

forming the first active layer, the source, and the drain respectively on the substrate;

forming a first gate insulating layer on the first active layer, a groove being opened on the first gate insulating layer, and the first gate insulating layer being located between the source and the drain in a direction parallel to the substrate;

forming the gate in the groove; and forming a second gate insulating layer on the gate, the second gate insulating layer being located between the source and the drain.

Optionally, forming a second gate insulating layer on the gate comprises:

performing oxidation treatment on a surface, away from the substrate, of the gate to form the second gate insulating layer.

Optionally, forming a second gate insulating layer on the gate comprises:

forming an insulating material film layer on the gate; and performing patterning treatment on the insulating material film layer to form the second gate insulating layer.

Optionally, the second active layer is connected to the first active layer.

Further, the source and the drain are wrapped in the first active layer and the second active layer.

At least one embodiment of the present disclosure provides an array substrate, the array substrate comprising the above-mentioned thin-film transistor.

At least one embodiment of the present disclosure provides a display apparatus, the array apparatus comprising the above-mentioned array substrate.

DETAILED DESCRIPTION OF THE EMBODIMENTS

DETAILED DESCRIPTION

The present disclosure will be described in further detail with reference to the enclosed drawings, to clearly present the principle, technical solutions, and advantages of the present disclosure.

Figure 1:
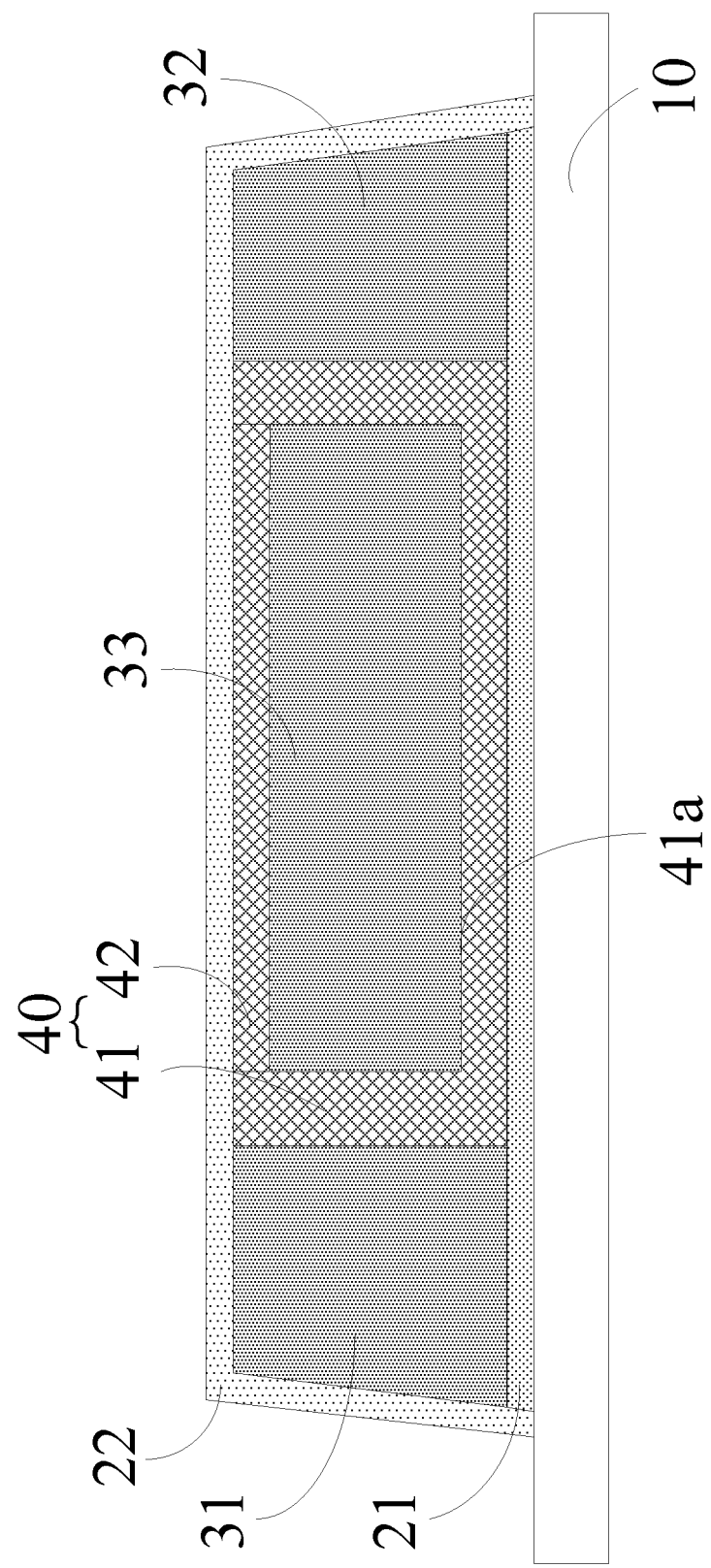
FIG. 1 is a diagram of a structure of a thin-film transistor according to an embodiment of the present disclosure.
Figure 2:
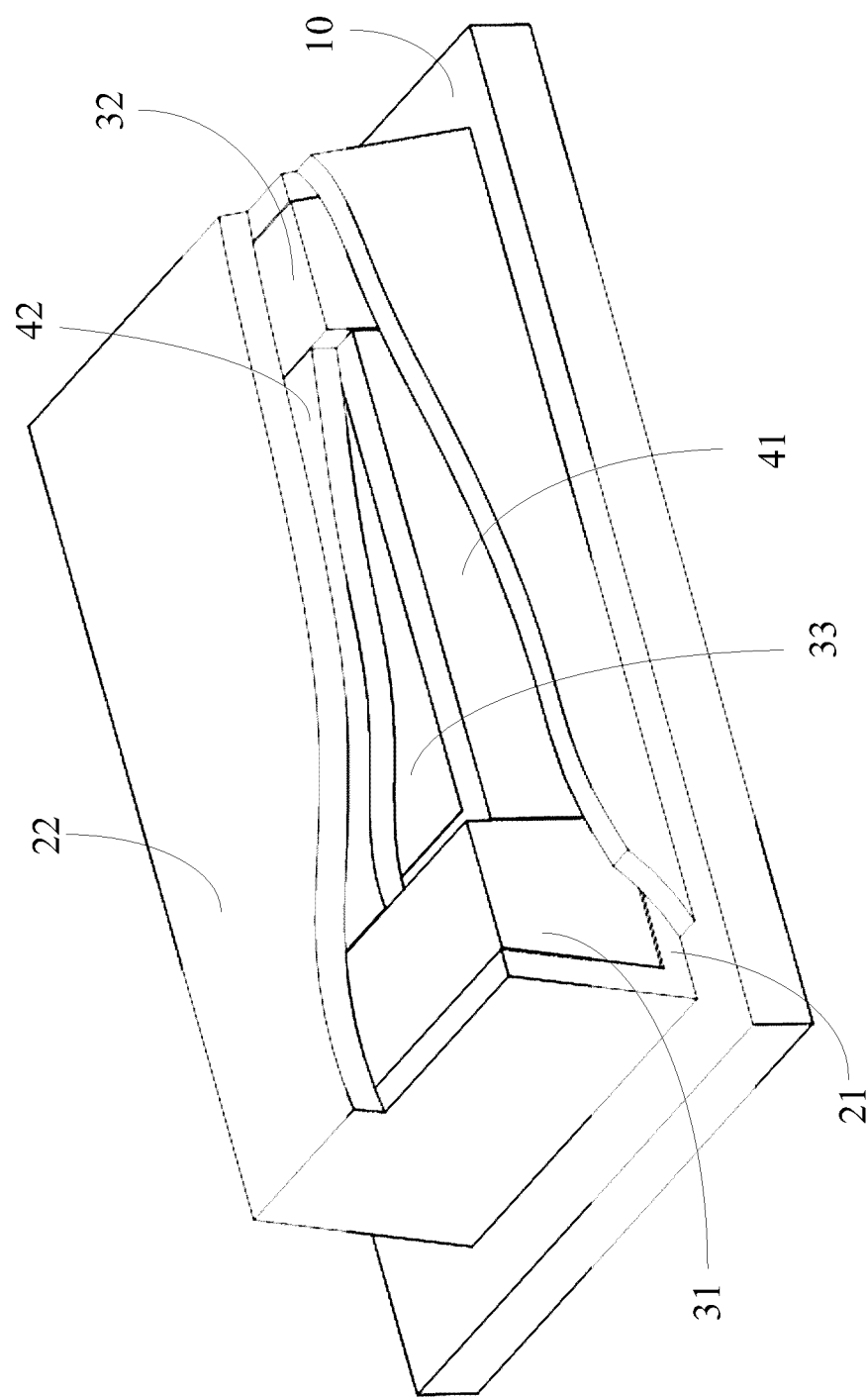
FIG. 2 is a diagram of a three-dimensional structure of a thin-film transistor according to an embodiment of the present disclosure.

FIG. 1 is a diagram of a structure of a thin-film transistor according to an embodiment of the present disclosure. FIG. 2 is a diagram of a three-dimensional structure of a thin-film transistor according to an embodiment of the present disclosure. For the convenience of description, part of the structure is removed from FIG. 2. In combination with FIG. 1 and FIG. 2, the thin-film transistor comprises a first active layer 21, a source 31, a drain 32, a gate 33, and a second active layer 22, wherein the source 31, the drain 32, and the gate 33 are disposed on the first active layer 21 with spacing, the gate 33 is located between the source 31 and the drain 32, the second active layer 22 is disposed on the gate 33, the source 31, and the drain 32, the source 31 and the drain 32 are both respectively connected to the first active layer 21 and the second active layer 22, and the gate 33 is respectively insulated from the first active layer 21, the second active layer 22, the source 31, and the drain 32.

In actual application, the thin-film transistor in FIG. 1 and FIG. 2 may be disposed on a substrate 10. It should be noted that the gate 33 being located between the source 31 and the drain 32 means that the gate 33 is located between the source 31 and the drain 32 in a direction parallel to the substrate 10.

In this embodiment of the present disclosure, a source and a drain are disposed on a first active layer, a gate is disposed between the source and the drain, the gate is insulated from the first active layer, the gate is insulated from the source, and the gate is insulated from the drain, so that when a voltage is applied to the gate, the source and the drain may be conducting via the first active layer. Meanwhile, a second active layer is disposed on the gate, the source, and the drain, and the gate is insulated from the second active layer, so that when a voltage is applied to the gate, the source and the drain may further be conducting via the second active layer. The source and the drain may be conducting at the same time via the first active layer and the second active layer when a thin-film transistor is turned on. Therefore, a larger current may flow between the source and the drain, and the on-state current of the thin-film transistor can be increased. Moreover, the first active layer and the second active layer are respectively disposed above and below the gate, and under the premise that the area of the first active layer is fixed, that is, under the premise that the first active layer has an area the same as that of a single active layer in related technologies, the on-state current of the thin-film transistor can be increased. Therefore, because the area of an active layer does not need to be increased to increase the on-state current of the thin-film transistor, the aperture ratio of a display apparatus is not affected accordingly.

As shown in FIG. 1, the thin-film transistor may further comprise an insulating layer 40. The insulating layer 40 wraps the gate 33. By using the structural form in which the insulating layer 40 wraps the gate 33, the gate 33 can be insulated from the source 31, the drain 32, the first active layer 21, and the second active layer 22 at the same time.

In implementation, the first active layer 21, the source 31, the second active layer 22, and the drain 32 form an enclosed space. The insulating layer 40 is disposed in the enclosed space. The gate 33 is disposed inside the insulating layer 40, and is therefore insulated from the first active layer 21, the source 31, the second active layer 22, and the drain 32 by using the insulating layer 40. The source 31, the drain 32, and the gate 33 may be connected to an external circuit through a via hole. The via hole of the gate 33 should be insulated from the second active layer 22.

Exemplarily, the insulating layer 40 may comprise a first gate insulating layer 41 and a second gate insulating layer 42. The first gate insulating layer 41 is disposed on the first active layer 21, and the first gate insulating layer 41 is located between the source 31 and the drain 32. A groove 41a is provided on the first gate insulating layer 41. The gate 33 is disposed in the groove 41a. The second gate insulating layer 42 is disposed on the gate 33. The second gate insulating layer 42 is disposed between the source 31 and the drain 32. The insulating layer 40 is disposed in the form of comprising the first gate insulating layer 41 and the second gate insulating layer 42, which may facilitate fabrication of the insulating layer 40. For a fabrication process of the insulating layer 40, reference may be made to a method of manufacturing a thin-film transistor below.

Optionally, the first gate insulating layer 41 may be made of a nitride, a metal oxide or a non-metal oxide, and the second gate insulating layer 42 may be made of a metal oxide or a non-metal oxide. The nitride comprises, but is not limited to, $SiN_x$. The non-metal oxide comprises, but is not limited to, $SiO_x$. The metal oxide comprises, but is not limited to, aluminum (Al) oxide, hafnium (Hf) oxide, and tantalum (Ta) oxide.

Exemplarily, the first gate insulating layer 41 and the second gate insulating layer 42 are made of a metal oxide. An insulating material formed of a metal oxide has a relatively high dielectric constant, and can help improve gate-control capability and increase switching speed.

As shown in FIG. 1, an orthographic projection of the gate 33 on the first active layer 21 and orthographic projections of the source 31 and the drain 32 on the first active layer 21 have overlapping areas of 0, that is, do not overlap. In this way, parasitic capacitance can be prevented between the gate 33 and the source 31 and between the gate 33 and the drain 32.

Optionally, the second active layer 22 may be connected to the first active layer 21. The second active layer 22 and the first active layer 21 may be connected into a whole, so that the source 31 and the drain 32 are wrapped in the first active layer 21 and the second active layer 22. In this way, a total contact area between the source 31 and the first active layer 21 and the second active layer 22 can be increased, and a total contact area between the drain 32 and the first active layer 21 and the second active layer 22 can be increased, which helps reduce contact resistance between the source 31 and the drain 32 and the first active layer 21 and the second active layer 22, and further increase the on current of the thin-film transistor. Certainly, in another embodiment, the second active layer 22 and the first active layer 21 may alternatively be not in direct connection, but instead are respectively connected to the source 31 and the drain 32.

Optionally, the first active layer 21 may be made of a silicon-based material or a zinc-oxide-based material. The second active layer 22 may be made of a silicon-based material or a zinc-oxide-based material. The silicon-based material comprises, but is not limited to, polycrystalline silicon and amorphous silicon. The zinc-oxide-based material comprises, but is not limited to, amorphous indium gallium zinc oxide.

In this embodiment, the first active layer 21 and the second active layer 22 are made of the same material. In another embodiment, the first active layer 21 and the second active layer 22 may alternatively be made of different materials. The present disclosure is not limited thereto.

Optionally, the thickness of the first active layer 21 may be 30 nm to 70 nm. The thickness of the second active layer 22 may be 30 nm to 70 nm. The first active layer 21 and the second active layer 22 may have an equal thicknesses or unequal thicknesses. The thicknesses of the first active layer 21 and the second active layer 22 may be set according to requirements to satisfy requirements of different thin-film transistors.

Optionally, the thickness of the source 31 may be 200 nm to 400 nm. The thickness of the drain 32 may be 200 nm to 400 nm. The thickness of the gate 33 may be 100 nm to 200 nm. The thicknesses of the source 31, the drain 32, and the gate 33 may be set according to requirements to satisfy requirements of different thin-film transistors.

In implementation, the metal used to fabricate the source 31, the drain 32, and the gate 33 comprises, but is not limited to, Al, Hf, and Ta, or may be an alloy formed of the foregoing metals.

It should be noted that the thickness in the present disclosure is the size in a direction perpendicular to a substrate. For example, the thickness of the source 31 being 300 nm means that the length of the source 31 in the direction perpendicular to the substrate is 300 nm.

Figure 3:
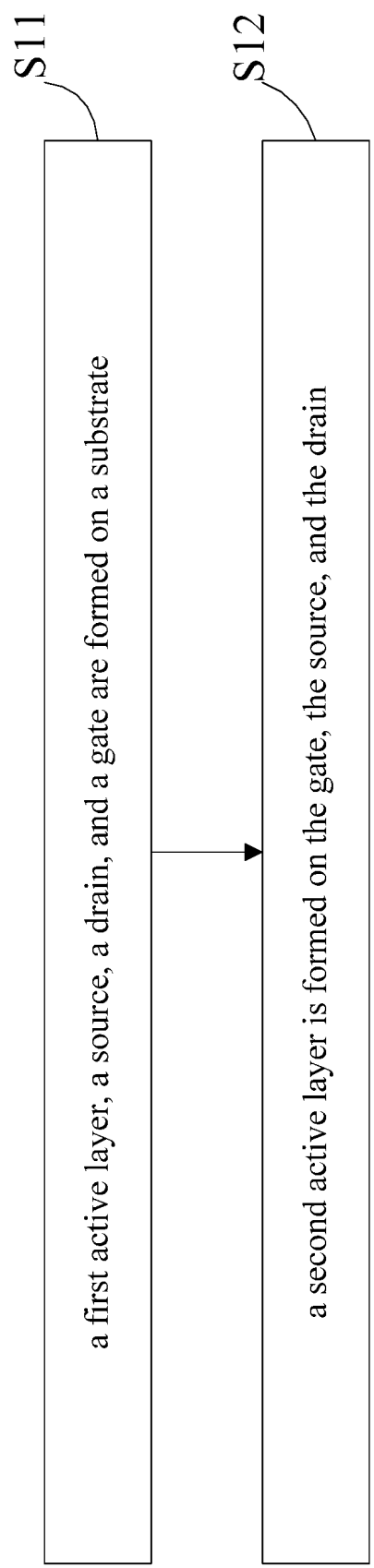
FIG. 3 is a flowchart of a method of manufacturing a thin-film transistor according to an embodiment of the present disclosure.

FIG. 3 is a flowchart of a method of manufacturing a thin-film transistor according to an embodiment of the present disclosure. This method may be used to manufacture the thin-film transistor shown in FIG. 1. As shown in FIG. 3, the method includes the following steps.

In step S11, a first active layer, a source, a drain, and a gate are formed on a substrate.

Herein, the source, the drain, and the gate are disposed on the first active layer with spacing, and the gate is located between the source and the drain in a direction parallel to the substrate.

In step S12, a second active layer is formed on the gate, the source, and the drain.

Herein, the source and the drain are both connected to the first active layer and the second active layer, and the gate is respectively insulated from the first active layer, the second active layer, the source, and the drain.

In this embodiment of the present disclosure, a source and a drain are disposed on a first active layer, a gate is disposed between the source and the drain, the gate is insulated from the first active layer, the gate is insulated from the source, and the gate is insulated from the drain, so that when a voltage is applied to the gate, the source and the drain may be conducting via the first active layer. Meanwhile, a second active layer is disposed on the gate, the source, and the drain, and the gate is insulated from the second active layer, so that when a voltage is applied to the gate, the source and the drain may further be conducting via the second active layer. The source and the drain may be conducting at the same time via the first active layer and the second active layer when a thin-film transistor is turned on. Therefore, a larger current may flow between the source and the drain, and the on-state current of the thin-film transistor can be increased. Moreover, the first active layer and the second active layer are respectively disposed above and below the gate, and under the premise that the area of the first active layer is fixed, that is, under the premise that the first active layer has an area the same as that of a single active layer in related technologies, the on-state current of the thin-film transistor can be increased. Therefore, because the area of an active layer does not need to be increased to increase the on-state current of the thin-film transistor, the aperture ratio of a display apparatus is not affected accordingly.

Figure 4:
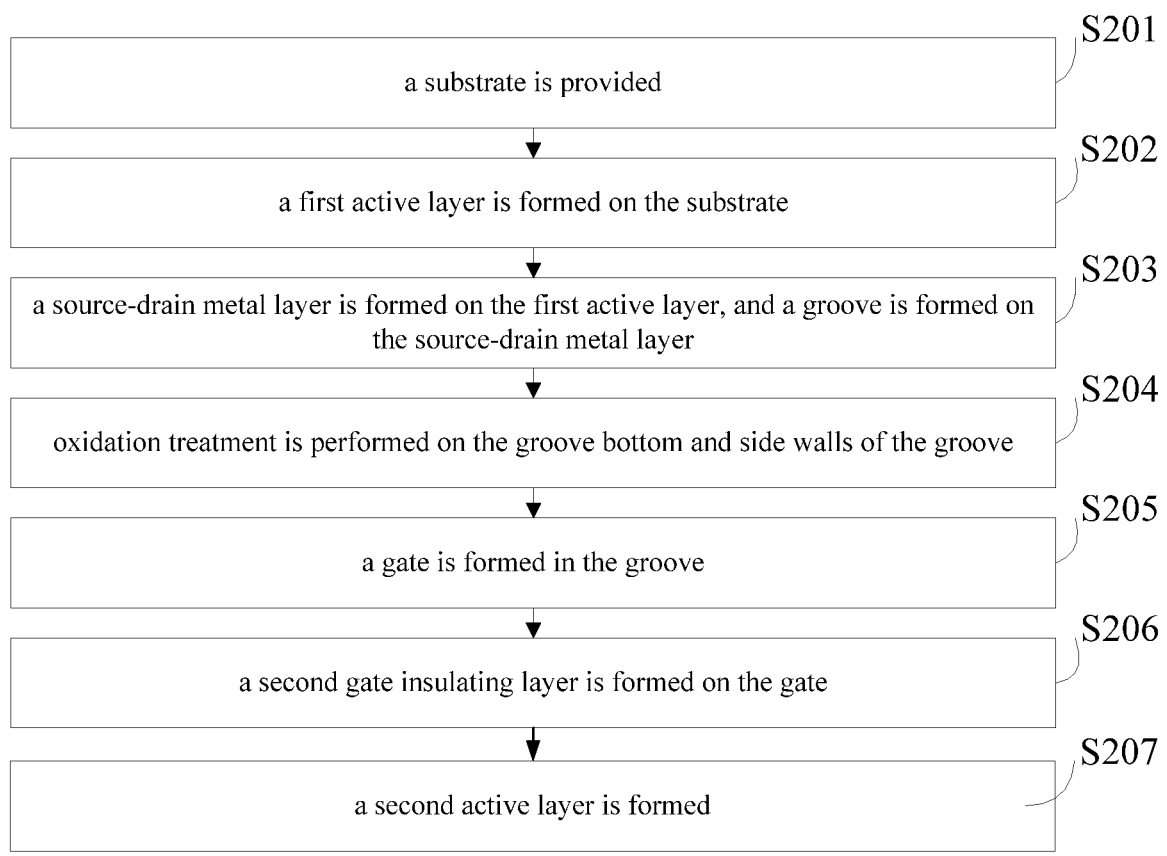
FIG. 4 is a flowchart of another method of manufacturing a thin-film transistor according to an embodiment of the present disclosure.

FIG. 4 is a flowchart of another method of manufacturing a thin-film transistor according to an embodiment of the present disclosure. The manufacturing method is used to manufacture the thin-film transistor shown in FIG. 1. The manufacturing method is described below in detail with reference to FIG. 5 to FIG. 9. As shown in FIG. 4, the manufacturing method comprises the following steps.

In step S201, a substrate is provided.

The substrate may be a transparent substrate, for example, a glass substrate, a silicon substrate, and a plastic substrate. Washing treatment may further be performed on the substrate in step S201.

In step S202, a first active layer is formed on the substrate.

Exemplarily, step S202 may comprise: forming an active material film layer on the substrate.

The first active layer is formed on the substrate by using a patterning process.

In implementation, an active material film layer may be formed in a deposition manner. The patterning process may use wet etching or may use dry etching.

Optionally, the first active layer may be made of a silicon-based material or a zinc-oxide-based material. The silicon-based material comprises, but is not limited to, polycrystalline silicon and amorphous silicon. The zinc-oxide-based material comprises, but is not limited to, amorphous indium gallium zinc oxide.

In step S203, a source-drain metal layer is formed on the first active layer, and a groove is formed on the source-drain metal layer.

Figure 5:
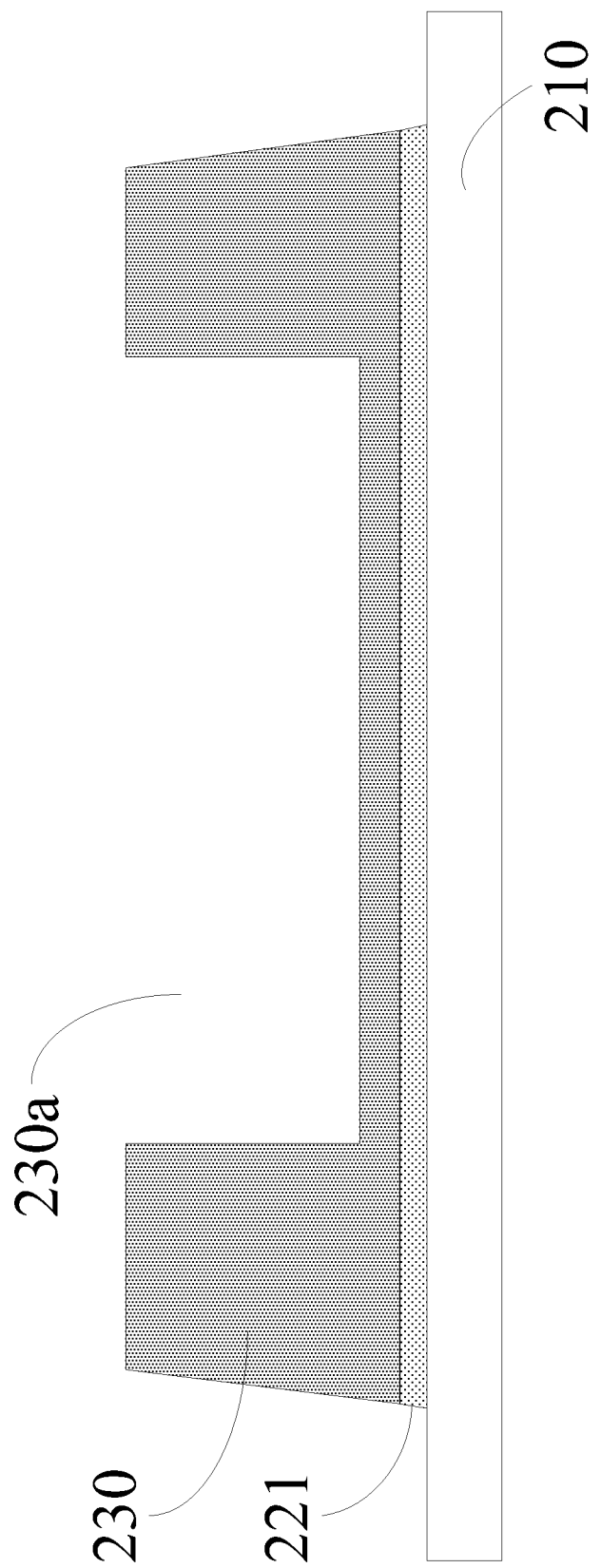
FIGS. 5-9 are diagrams of a process of manufacturing a thin-film transistor according to an embodiment of the present disclosure.

As shown in FIG. 5, a first active layer 221 and a source-drain metal layer 230 are sequentially formed on a substrate 210. A groove 230a is formed on the source-drain metal layer 230, and the depth of the groove 230a is less than the thickness of the source-drain metal layer 230.

Exemplarily, step S203 may comprise: forming an electrode material film layer on the first active layer.

The source-drain metal layer 230 and the groove 230a are formed by using a patterning process.

For example, the electrode material film layer may be formed on the first active layer in a sputtering manner.

In implementation, the metal used to fabricate the electrode material film layer comprises, but is not limited to, Al, Hf, and Ta, or may be an alloy formed of the foregoing metals.

In step S204, oxidation treatment is performed on the groove bottom and side walls of the groove.

Figure 6:
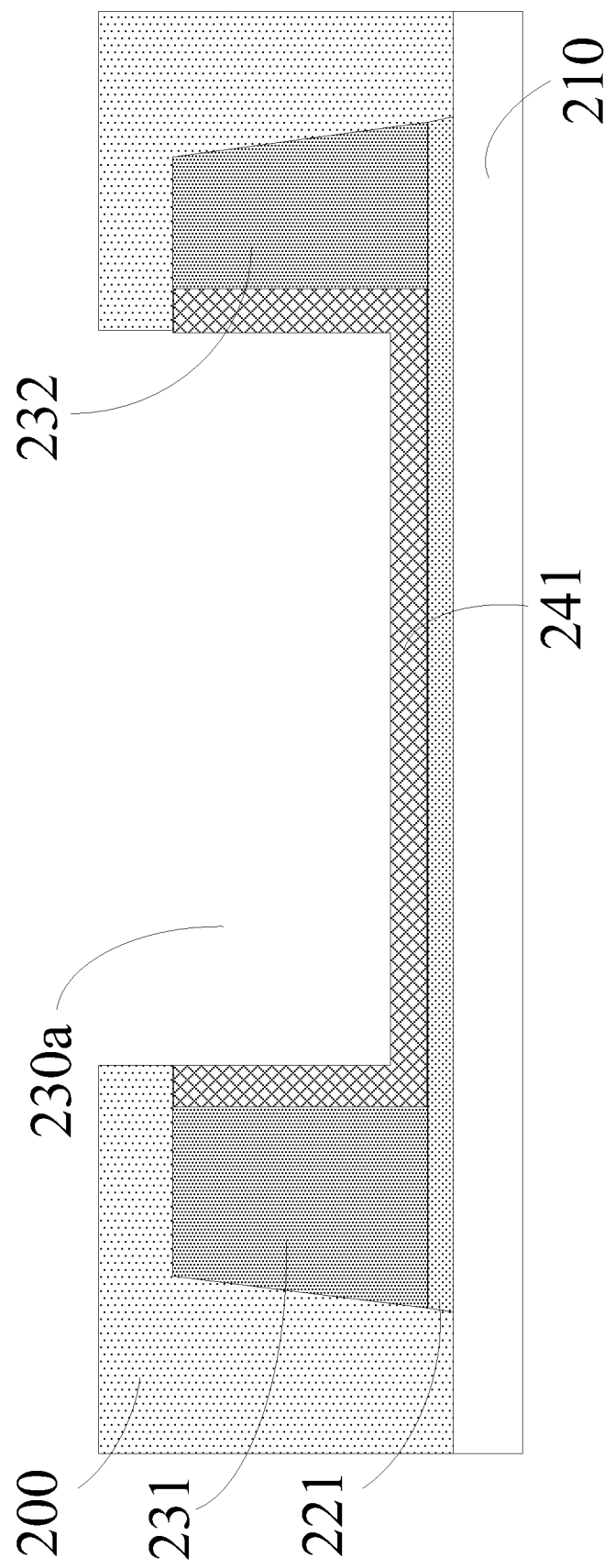

As shown in FIG. 6, the oxidation treatment is performed on the groove bottom and side walls of the groove 230a to form a source 231, a drain 232, and a first gate insulating layer 241. The first gate insulating layer 241 separates the source 231 and the drain 232. A part of the source-drain metal layer 230 is processed into the source 231 and the drain 232, and another part of the source-drain metal layer 230 is processes into the first gate insulating layer 241, so that material usage can be reduced. Meanwhile, the first gate insulating layer 241 formed by oxidizing the source-drain metal layer 230 is a metal oxide that has a relatively high dielectric constant and can help improve gate-control capability and increase switching speed.

It should be noted that the depth of oxidation treatment at the groove bottom of the groove 230a is equal to the thickness of the source-drain metal layer 230 at the groove bottom of the groove, so as to ensure that the source-drain metal layer 230 is oxidized as the source 231, the first gate insulating layer 241, and the drain 232 that are arranged in a row in a direction parallel to the substrate 210.

In implementation, the oxidation treatment may be performed in an electrolyte tank.

Exemplarily, step S204 may comprise: immersing the source-drain metal layer 230 in a solution, and performing oxidation treatment by using the source-drain metal layer 230 as an anode.

Optionally, the solution may be a citric acid solution.

In implementation, the oxidation treatment may be performed in a constant-current constant-voltage mode. That is, during the oxidation treatment, the current and voltage are controlled to be constant. In this way, the source-drain metal layer 230 can be oxidized at a constant speed, and it is easy to control the depth of oxidation by using an oxidation time.

Optionally, a carbon rod or a lead rod may be used as a cathode.

In implementation, before the source-drain metal layer 230 is immersed in the solution, a passivation layer 200 may be formed on the first active layer 221 and the source-drain metal layer 230 to prevent the source-drain metal layer 230 from excessive oxidation, that is, prevent oxidation of the part used to form the source 231 and the drain 232 of the source-drain metal layer 230.

Exemplarily, the passivation layer 200 covers the substrate 210 and the source-drain metal layer 230 and exposes the groove 230a.

Optionally, in step S204, after the fabrication of the groove 230a is completed by using a patterning process, a photoresist located outside the groove can be kept, and the kept photoresist is used as the passivation layer 200 to prevent excessive oxidation of the source-drain metal layer 230.

After step S204, the passivation layer 200 may be kept for use in subsequent steps.

In step S205, a gate is formed in the groove.

Figure 7:
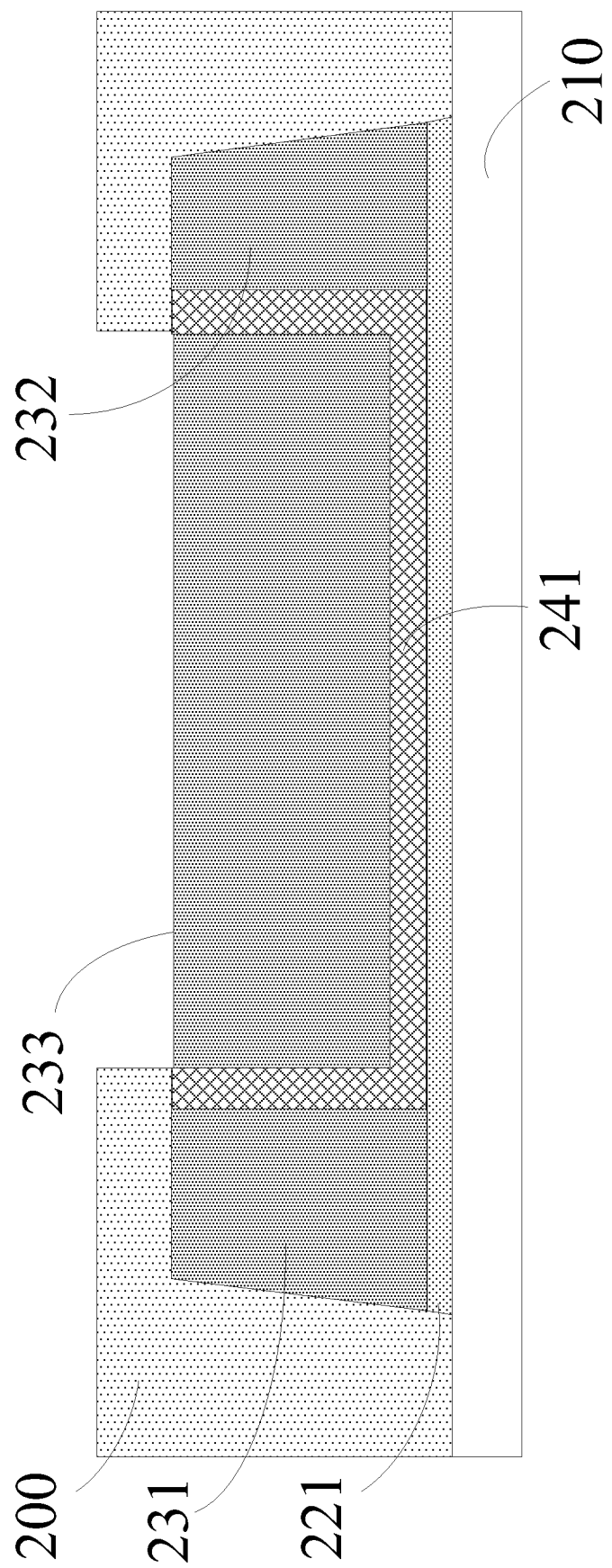

As shown in FIG. 7, a gate 233 is formed in the groove 230a.

Optionally, step S205 may comprise: forming a gate material film layer on the first gate insulating layer 241.

The gate 233 is formed in the groove 230a by using a patterning process.

In implementation, the gate material film layer may be formed or the gate 233 may be formed in the groove 230a in a sputtering manner. The material used to fabricate the gate 233 comprises, but is not limited to, Al, Hf, and Ta, or may be an alloy formed of the foregoing metals.

The passivation layer 200 covers the part other than the groove 230a. Therefore, during fabrication of the gate 233, the gate material film layer located on the passivation layer 200 may be directly stripped, so that the gate 233 is formed in the groove 230a.

After step S205, the passivation layer 200 may continue to be kept for use in subsequent steps.

In step S206, a second gate insulating layer is formed on the gate.

Figure 8:
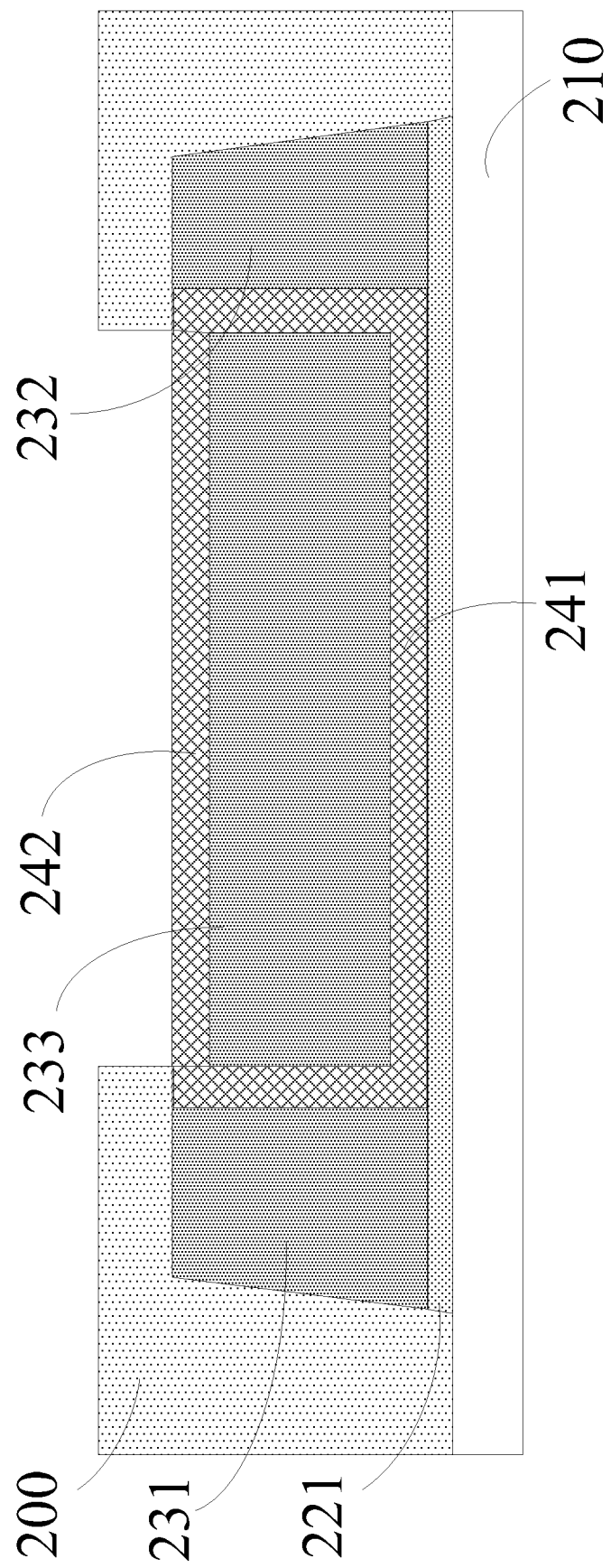

As shown in FIG. 8, a second gate insulating layer 242 is located between the source 231 and the drain 232.

Optionally, step S206 may comprise: performing oxidation treatment on a surface, away from the substrate 210, of the gate 233 to form the second gate insulating layer 242.

A process of performing oxidation treatment on the gate 233 is similar to the foregoing process of performing oxidation treatment on the source-drain metal layer 230, and is no longer described in detail herein. During oxidation of the gate 233, the passivation layer 200 kept in step S205 may be used to prevent oxidation of an area other than the gate 233.

The material of a part of the gate is oxidized to form the second gate insulating layer, so that material usage can be reduced. Meanwhile, the second gate insulating layer formed by oxidizing the material of the gate is a metal oxide, has a relatively high dielectric constant, and can help improve gate-control capability and increase switching speed.

Optionally, step S206 may further comprise: forming an insulating material film layer on the gate 233.

The second gate insulating layer 242 is formed by using a patterning process.

In implementation, an insulating material film layer may be formed in a deposition manner. The material used to fabricate the insulating material film layer may be a nitride or a non-metal oxide, which comprises, but is not limited to, SiOx and SiNx. A layer of material is additionally deposited on the gate 233 to fabricate the second gate insulating layer 242. A fabrication process is simple, and it is convenient to select the material of the second gate insulating layer 242 to satisfy different process requirements.

It is readily conceivable that in the two methods of the fabrication of the second gate insulating layer 242 by using a method of oxidizing the gate 233 and the fabrication of the second gate insulating layer 242 by using a method of additionally depositing a layer of material, the thickness of the gate 233 formed in step S205 in the former method should be greater than the thickness of the gate 233 formed in step S205 in the latter method, so as to ensure that the gate 233 has a sufficient thickness after the second gate insulating layer 242 is formed.

A surface, away from the substrate 210, of the second gate insulating layer 242 may be flush with a surface, away from the substrate 210, of the source 231 or the drain 232 to facilitate the subsequent formation of a second active layer.

After the fabrication of the second gate insulating layer 242 is completed, the passivation layer 200 kept in the foregoing step may be removed.

In step S207, a second active layer is formed.

Figure 9:
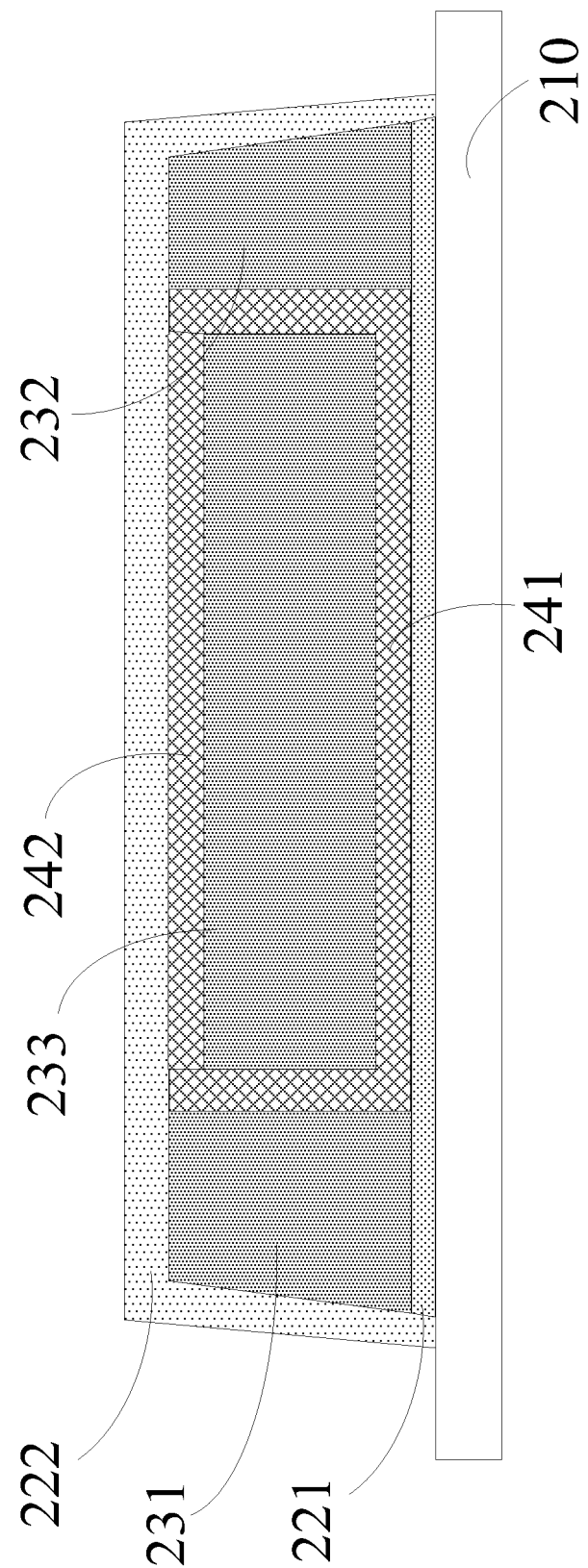

As shown in FIG. 9, a second active layer 222 is formed on the source 231, the drain 232, and the second gate insulating layer 242.

In implementation, the second active layer 222 may be formed in a deposition manner. The second active layer 222 may be made of a silicon-based material or a zinc-oxide-based material. The silicon-based material comprises, but is not limited to, polycrystalline silicon and amorphous silicon. The zinc-oxide-based material comprises, but is not limited to, amorphous indium gallium zinc oxide.

As shown in FIG. 9, the second active layer 222 may be connected to the first active layer 221. The second active layer 222 and the first active layer 221 may be connected into a whole, so that the source 231 and the drain 232 are wrapped in the first active layer 221 and the second active layer 222. In this way, a total contact area between the source 231 and the first active layer 221 and the second active layer 222 can be increased, and a total contact area between the drain 232 and the first active layer 221 and the second active layer 222 can be increased, which helps reduce contact resistance between the source 231 and the drain 232 and the first active layer 221 and the second active layer 222, and further increases the on-state current of the thin-film transistor.

In this embodiment, the first active layer 221 and the second active layer 222 are made of the same material. In another embodiment, the first active layer 221 and the second active layer 222 may alternatively be made of different materials. The present disclosure is not limited thereto.

Figure 10:
FIG. 10 is a flowchart of yet another method of manufacturing a thin-film transistor according to an embodiment of the present disclosure.

FIG. 10 is a flowchart of yet another method of manufacturing a thin-film transistor according to an embodiment of the present disclosure. The manufacturing method is used to manufacture the thin-film transistor shown in FIG. 1. Compared with the method shown in FIG. 4, the difference is that the first active layer and the source-drain metal layer is formed through a single patterning process. The manufacturing method is described below in detail with reference to FIG. 11 to FIG. 12. As shown in FIG. 10, the manufacturing method comprises the following steps.

In step S301, a substrate is provided.

The substrate may be a transparent substrate, for example, a glass substrate, a silicon substrate, and a plastic substrate. Washing treatment may further be performed on the substrate in step S301.

In step S302, an active material film layer and a source-drain material film layer are sequentially formed on the substrate.

Figure 11:
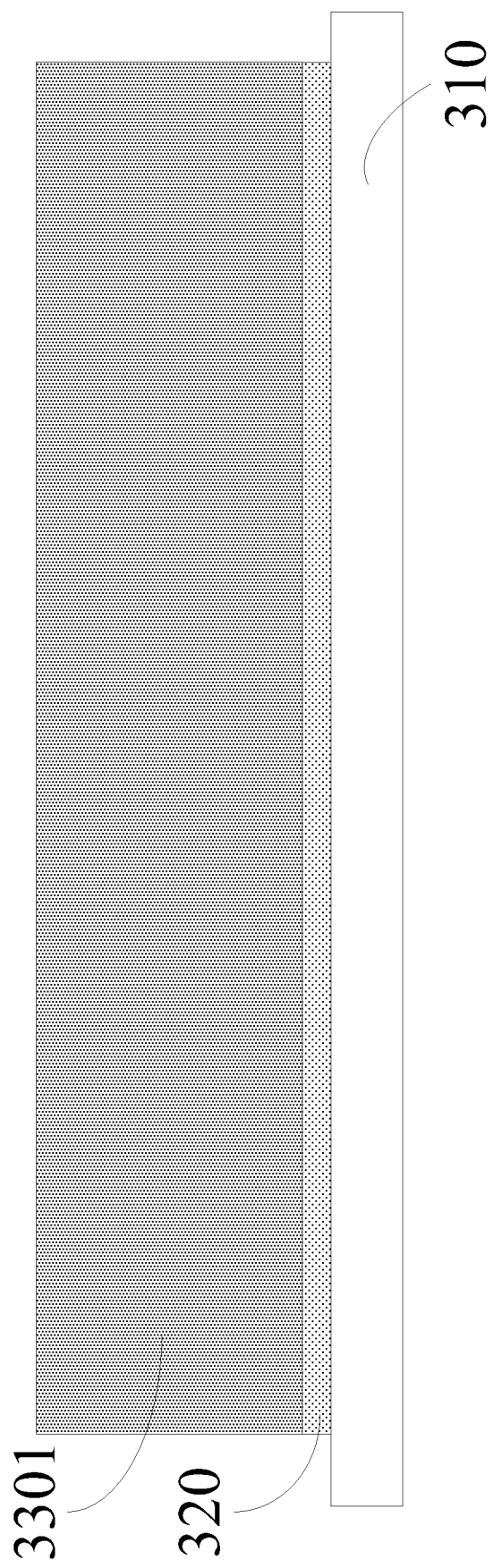
FIGS. 11-12 are diagrams of another process of manufacturing a thin-film transistor according to an embodiment of the present disclosure.

As shown in FIG. 11, an active material film layer 320 and an electrode material film layer 3301 are sequentially formed on the substrate 310. The active material film layer 320 may be formed through deposition, and the electrode material film layer 3301 may be formed on the active material film layer 320 through sputtering.

Optionally, the active material film layer 320 may be made of a silicon-based material or a zinc-oxide-based material. The silicon-based material comprises, but is not limited to, polycrystalline silicon and amorphous silicon. The zinc-oxide-based material comprises, but is not limited to, amorphous indium gallium zinc oxide.

In implementation, the electrode material film layer 3301 is made of a metal material, which comprises, but is not limited to, Al, Hf, and Ta, or may be an alloy formed of the foregoing metals.

In step S303, a first active layer and a source-drain metal layer are formed, and a groove is formed on the source-drain metal layer.

Figure 12:
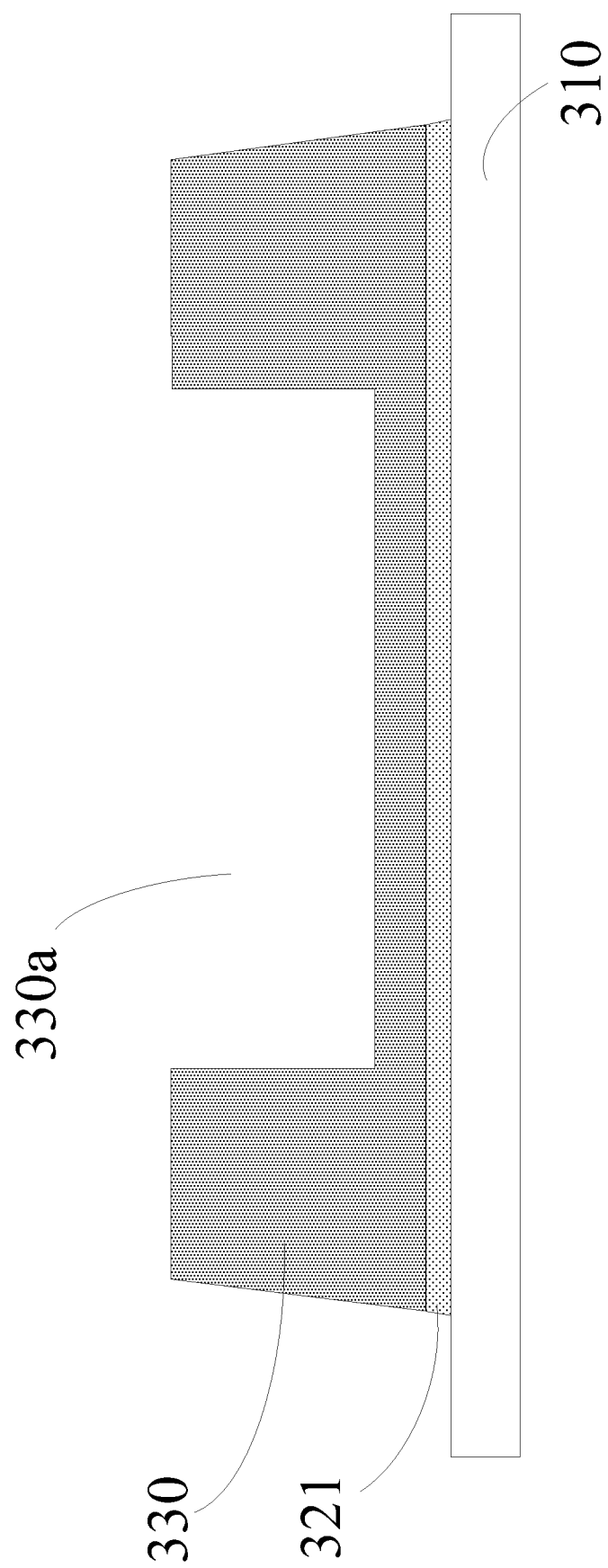

As shown in FIG. 12, a patterning process may be performed on the electrode material film layer 3301 and the active material film layer 320 to form the first active layer 321 and the source-drain metal layer 320 sequentially arranged on the substrate 310. Compared with the method shown in FIG. 4, this method may reduce one patterning process to manufacture the first active layer 321 and the source-drain metal layer 320, which simplifies the manufacturing process and reduces the manufacturing cost.

In step S304, oxidation treatment is performed on the groove bottom and side walls of the groove.

In the present embodiment, step S304 may be the same as step S204 and will not repeated here.

In step S305, a gate is formed in the groove.

In the present embodiment, step S305 may be the same as step S205 and will not repeated here.

In step S306, a second gate insulating layer is formed on the gate.

In the present embodiment, step S306 may be the same as step S206 and will not repeated here.

In step S307, a second active layer is formed.

In the present embodiment, step S307 may be the same as step S207 and will not repeated here.

Figure 13:
FIG. 13 is a flowchart of still yet another method of manufacturing a thin-film transistor according to an embodiment of the present disclosure.

FIG. 13 is a flowchart of another method of manufacturing a thin-film transistor according to an embodiment of the present disclosure. The manufacturing method is used to manufacture the thin-film transistor shown in FIG. 1. A difference of the method from the method shown in FIG. 4 lies in that a first gate insulating layer is fabricated by using a patterning process. The manufacturing method is described below in detail with reference to FIG. 14 and FIG. 15. As shown in FIG. 13, the manufacturing method comprises the following steps.

In step S401, a substrate is provided.

In this embodiment, step S401 may be the same as step S201, and is no longer described herein.

In step S402, a first active layer is formed on the substrate.

In this embodiment, step S402 may be the same as step S202, and is no longer described herein.

In step S403, a source and a drain are formed on the first active layer.

Figure 14:
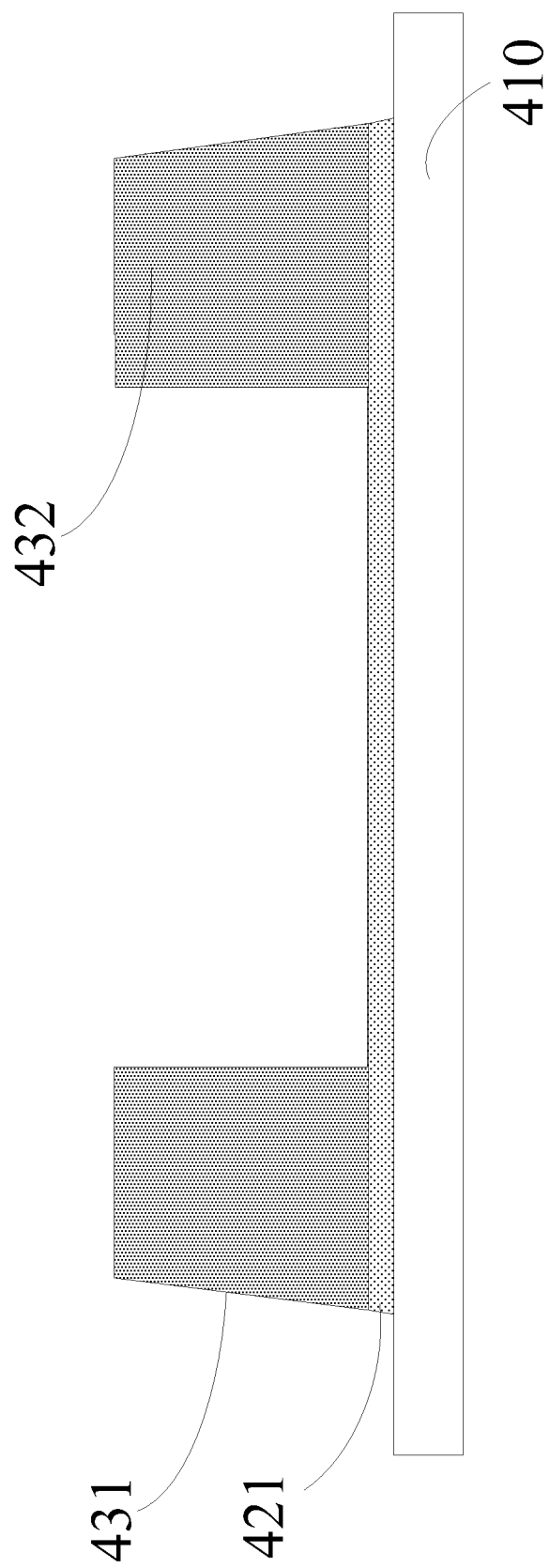
FIGS. 14-15 are diagrams of yet another process of manufacturing a thin-film transistor according to an embodiment of the present disclosure.

As shown in FIG. 14, a source 431 and a drain 432 disposed with spacing are formed on a first active layer 421.

In this embodiment, step S403 may comprise: forming an electrode material film layer on the first active layer.

The source and the drain are formed by using a patterning process.

For example, the electrode material film layer may be formed on the first active layer in a sputtering manner.

In implementation, the material used to fabricate the source 431 and the drain 432 comprises, but is not limited to, Al, Hf, and Ta, or may be an alloy formed of the foregoing metals.

In step S404, a first gate insulating layer is formed on the first active layer.

Figure 15:
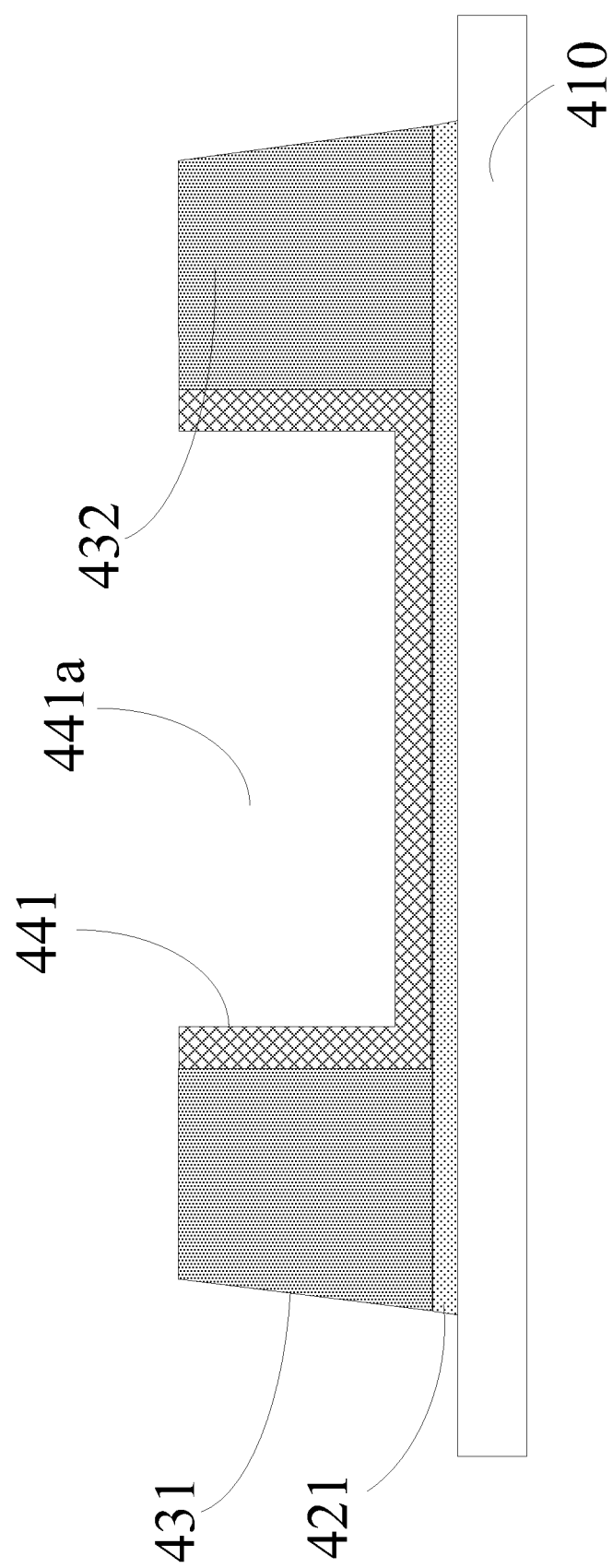

As shown in FIG. 15, a groove 441a is opened on the first gate insulating layer 441, and the first gate insulating layer 441 is located between the source 431 and the drain 432 in a direction parallel to a substrate 410.

In this embodiment, Step S404 may comprise: forming an insulating material film layer on the first active layer 421. The insulating material film layer covers the substrate 410, the first active layer 421, the source 431, and the drain 432. The first gate insulating layer 441 is formed by using a patterning process.

Optionally, a patterning process may be used to remove all the insulating material film layer located on the substrate 410, the source 431, and the drain 432 and remove a part of the insulating material film layer located on the first active layer 421 between the source 431 and the drain 432, so as to form the first gate insulating layer 441 having the groove 441a.

In implementation, an insulating material film layer may be formed in a deposition manner. The material used to fabricate the first gate insulating layer 441 may be a nitride or a non-metal oxide, which comprises, but is not limited to, $SiO_x$ and $SiN_x$. A layer of material is additionally deposited on the first active layer 421 to fabricate a first gate insulating layer 442. A fabrication process is simple, and it is convenient to select the material of the first gate insulating layer 441 to satisfy different process requirements.

In step S405, a gate is formed in a groove.

In this embodiment, step S405 may be the same as step S205, and is no longer described herein.

In step S406, a second gate insulating layer is formed on the gate, wherein the second gate insulating layer is located between the source and the drain.

In this embodiment, step S406 may be the same as step S206, and is no longer described herein.

In step S407, a second active layer is formed.

In this embodiment, step S407 may be the same as step S207, and is no longer described herein.

In another implementation manner of the present disclosure, a method similar to the manufacturing method in Step S302 and Step S303 may be used in Step S402 and Step S403, which may be replaced with the following step: sequentially forming an active material film layer and the electrode material film layer on the substrate.

The first active layer, the source, and the drain are formed.

The electrode material film layer and the active material film layer may be treated by using a patterning process to form the first active layer on the substrate and the source and the drain that are arranged with spacing on the first active layer. In this way, the fabrication of the first active layer, the source, and the drain can be completed by using only one patterning process, so that a fabrication process is simplified and fabrication costs are reduced.

It is readily conceivable that during the treatment of the electrode material film layer and the active material film layer by using a patterning process, a halftone mask may be used to enable the etching depth in an area between the source and the drain to be less than the etching depth in an area other than the source and the drain.

For example, the active material film layer may be formed in a deposition manner, and the electrode material film layer is formed on the first active layer by using a sputtering manner.

Figure 16:
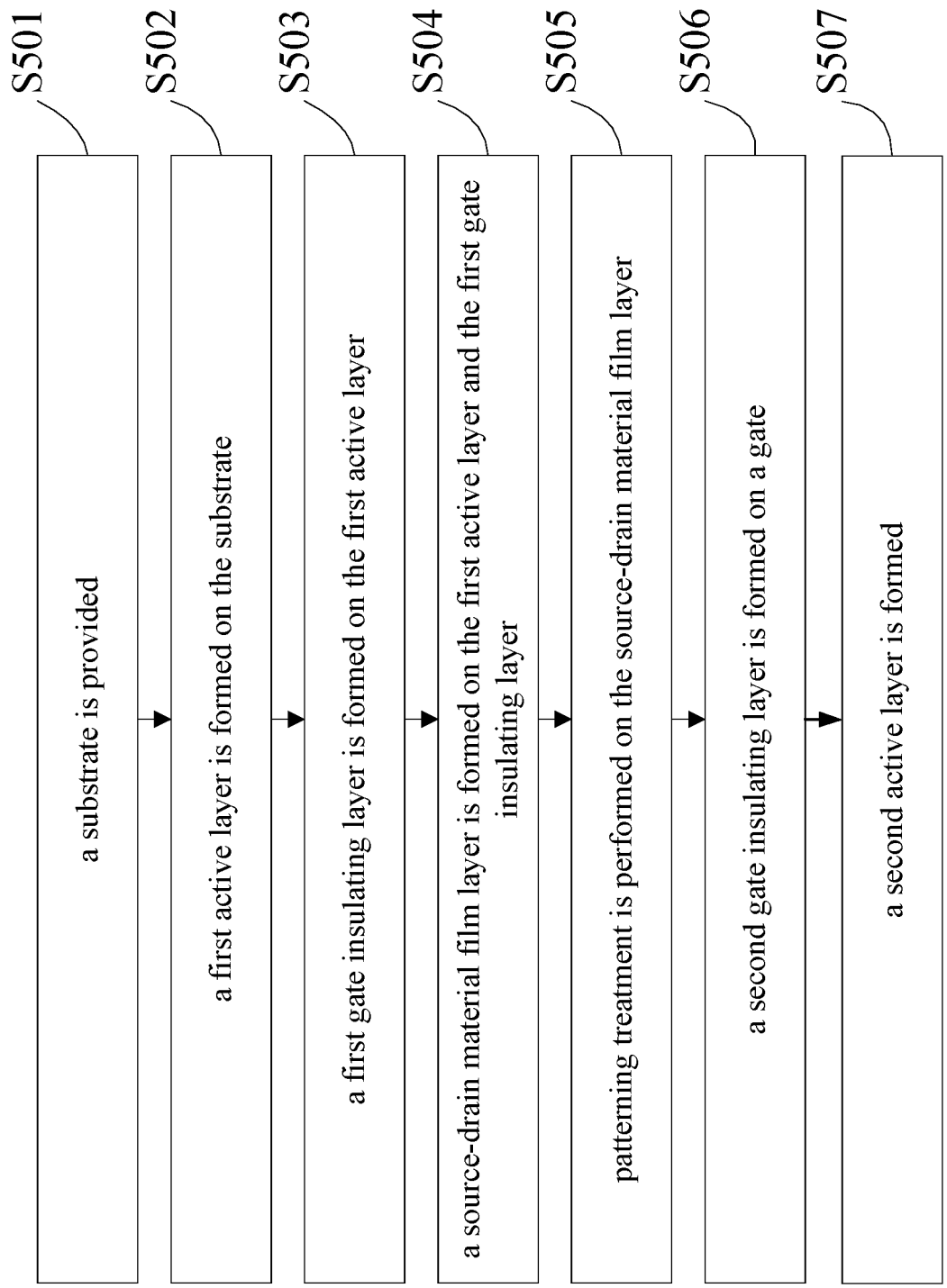
FIG. 16 is a flowchart of still yet another method of manufacturing a thin-film transistor according to an embodiment of the present disclosure.

FIG. 16 is a flowchart of another method of manufacturing a thin-film transistor according to an embodiment of the present disclosure. The manufacturing method is used to manufacture the thin-film transistor shown in FIG. 1. A difference of the method from the method shown in FIG. 4 lies in the fabrication of a gate, a source, and a drain. The manufacturing method is described below in detail with reference to FIG. 17 to FIG. 19. As shown in FIG. 16, the manufacturing method comprises the following steps.

In step S501, a substrate is provided.

In this embodiment, step S501 may be the same as step S201, and is no longer described herein.

In step S502, a first active layer is formed on the substrate.

In this embodiment, step S502 may be the same as step S202, and is no longer described herein.

In step S503, a first gate insulating layer is formed on the first active layer, and a groove is formed on the first gate insulating layer.

Figure 17:
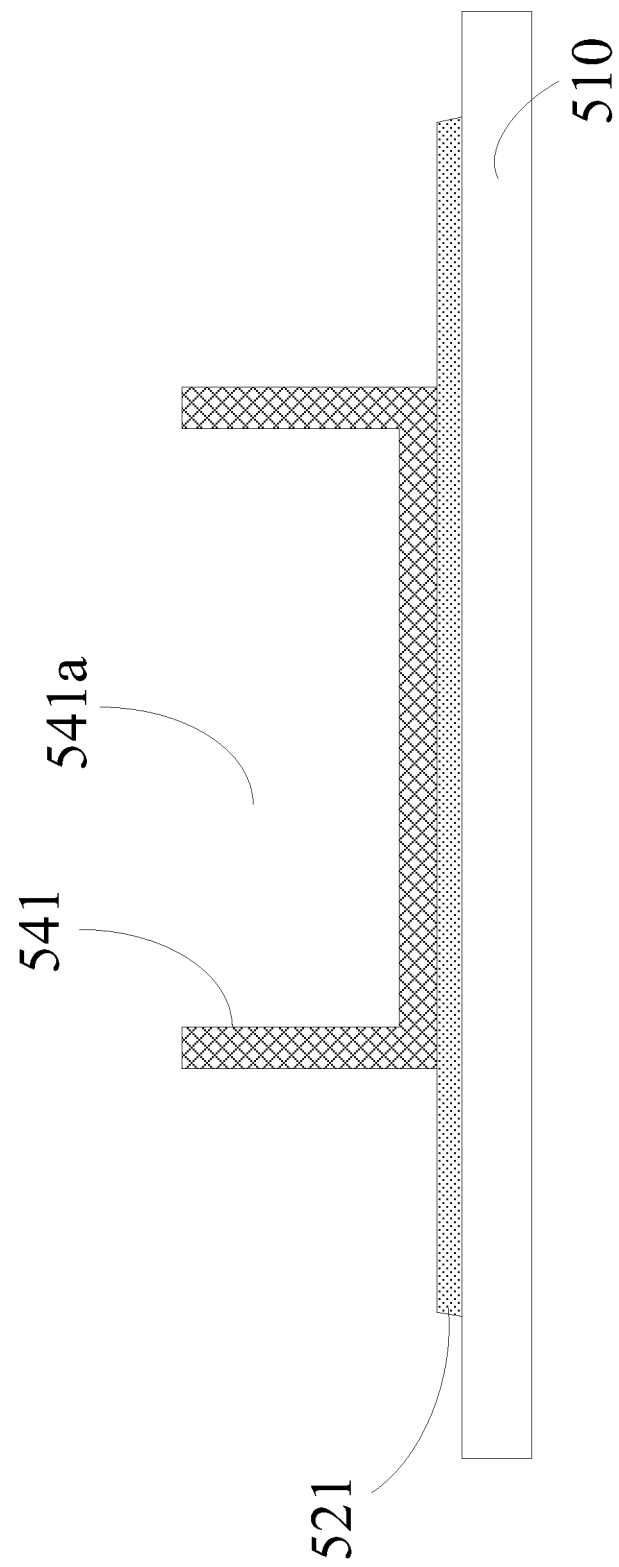
FIGS. 17-19 are diagrams of still yet another process of manufacturing a thin-film transistor according to an embodiment of the present disclosure.

As shown in FIG. 17, a groove 541a is opened on the first gate insulating layer 541, and an orthographic projection of the first gate insulating layer 541 on a first active layer 521 is located in the first active layer 521.

Optionally, step S503 may comprise: forming an insulating material film layer on the first active layer 521.

The first gate insulating layer 541 is formed by using a patterning process.

Further, a halftone mask may be used in the patterning process to perform exposure to remove a part of the insulating material film layer located in an area for forming the groove 541a and all the insulating material film layer in an area for forming a source and a drain on the first active layer 521, so as to form the first gate insulating layer 541 having the groove 541a on the first active layer 521.

In implementation, an insulating material film layer may be formed in a deposition manner. The material used to fabricate the first gate insulating layer 541 may be a nitride or a non-metal oxide, which comprises, but is not limited to, SiO$_x$ and SiN$_x$. A layer of material is additionally deposited on the first active layer 521 to fabricate a first gate insulating layer 542. A fabrication process is simple, and it is convenient to select the material of the first gate insulating layer 541 to satisfy different process requirements.

In step S504, an electrode material film layer is formed on the first active layer and the first gate insulating layer.

Figure 18:
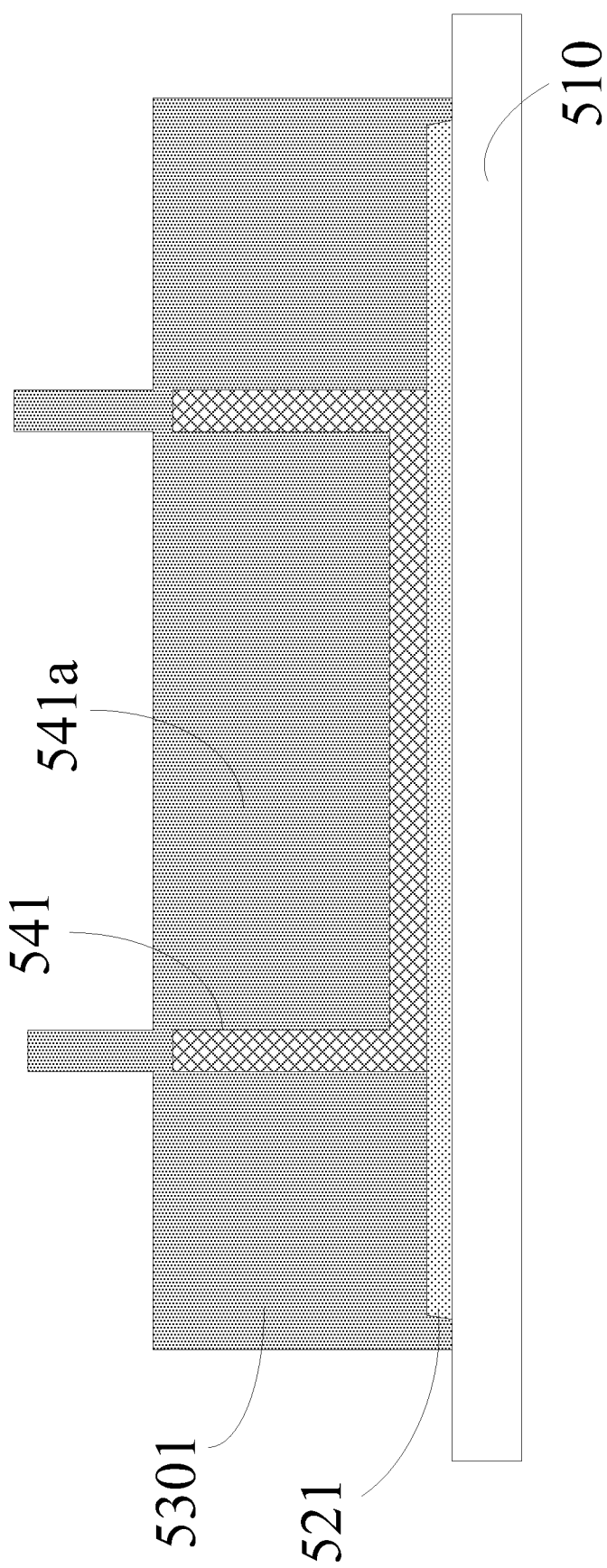

As shown in FIG. 18, an electrode material film layer 5301 is formed on the first active layer 521 and the first gate insulating layer 541. For example, the electrode material film layer 5301 may be formed by using a sputtering manner.

In implementation, the electrode material film layer may be, but is not limited to, Al, Hf, and Ta, or may be an alloy formed of the foregoing metals.

In step S505, patterning treatment is performed on the electrode material film layer.

Figure 19:
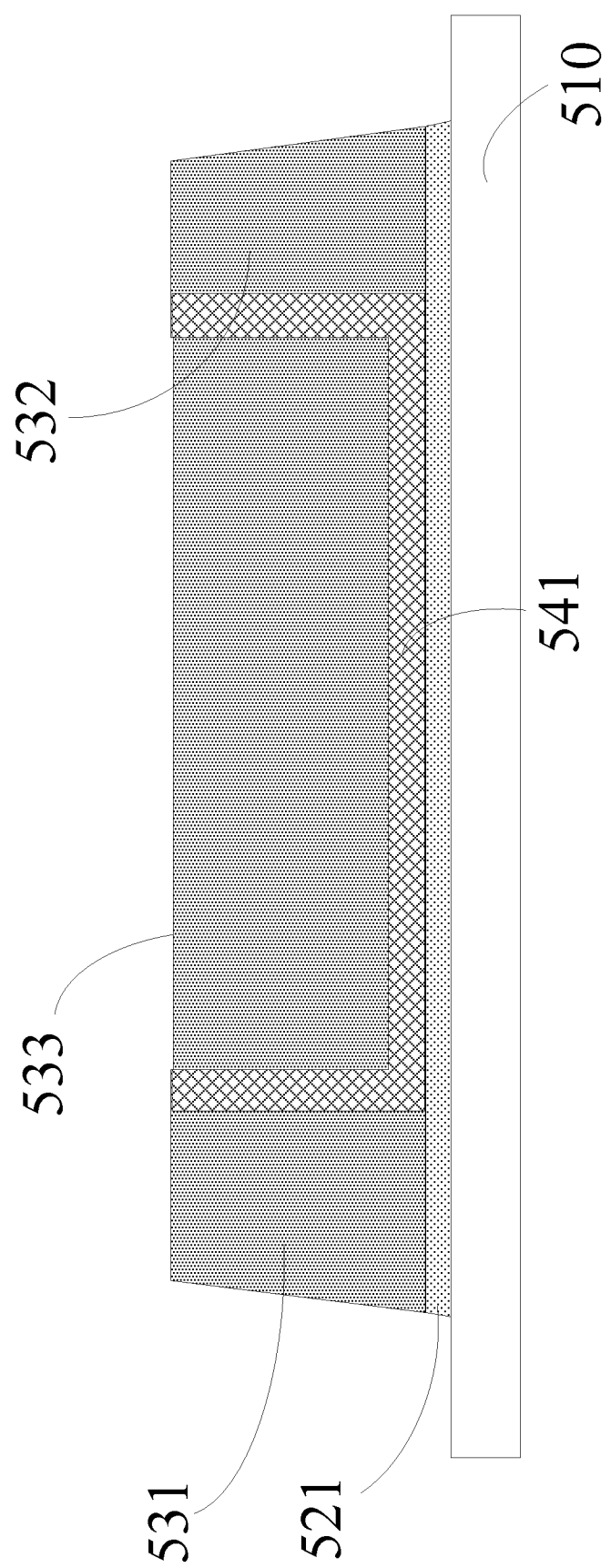

As shown in FIG. 19, patterning treatment is performed on the electrode material film layer 5301, to form a source 531 and a drain 532 on the first active layer 541 and form a gate 541 in the groove 541a. The first gate insulating layer 541 is located between the source 531 and the drain 532 in a direction parallel to a substrate 510.

For example, patterning treatment may be performed on the electrode material film layer 5301 using a patterning process. The source 531, the drain 532, and the gate 533 are formed at the same time by using one patterning process, and the fabrication efficiency can be improved.

It is readily conceivable that during the treatment of the electrode material film layer 5301 by using a patterning process, a halftone mask may be used to remove different thicknesses of the electrode material film layer 5301 in different areas.

In step S506, a second gate insulating layer is formed on a gate, and the second gate insulating layer is located between a source and a drain.

In this embodiment, step S506 may be the same as step S206, and is no longer described herein.

In step S507, a second active layer is formed.

In this embodiment, step S507 may be the same as step S207, and is no longer described herein.

It should be noted that the patterning process in the present disclosure comprises photoresist coating, exposure, development, etching, photoresist stripping, and the like.

The embodiments of the present disclosure further provide an array substrate, comprising the thin-film transistor shown in FIG. 1.

In this embodiment of the present disclosure, a source and a drain are disposed on a first active layer, a gate is disposed between the source and the drain, the gate is insulated from the first active layer, the gate is insulated from the source, and the gate is insulated from the drain, so that when a voltage is applied to the gate, the source and the drain may be conducting via the first active layer. Meanwhile, a second active layer is disposed on the gate, the source, and the drain, and the gate is insulated from the second active layer, so that when a voltage is applied to the gate, the source and the drain may further be conducting via the second active layer. The source and the drain may be conducting at the same time via the first active layer and the second active layer when a thin-film transistor is turned on. Therefore, a larger current may flow between the source and the drain, and the on-state current of the thin-film transistor can be increased. Moreover, the first active layer and the second active layer are respectively disposed above and below the gate, and under the premise that the area of the first active layer is fixed, that is, under the premise that the first active layer has an area the same as that of a single active layer in related technologies, the on-state current of the thin-film transistor can be increased. Therefore, because the area of an active layer does not need to be increased to increase the on-state current of the thin-film transistor, the aperture ratio of a display apparatus is not affected accordingly.

The embodiments of the present disclosure further provide a display apparatus, comprising the above-mentioned array substrate. The display apparatus provided in the embodiments of the present disclosure may be a mobile phone, a tablet, a TV, a display, a laptop computer, a digital photo frame, a navigator, or any other products or parts with display functionality.

In this embodiment of the present disclosure, a source and a drain are disposed on a first active layer, a gate is disposed between the source and the drain, the gate is insulated from the first active layer, the gate is insulated from the source, and the gate is insulated from the drain, so that when a voltage is applied to the gate, the source and the drain may be conducting via the first active layer. Meanwhile, a second active layer is disposed on the gate, the source, and the drain, and the gate is insulated from the second active layer, so that when a voltage is applied to the gate, the source and the drain may further be conducting via the second active layer. The source and the drain may be conducting at the same time via the first active layer and the second active layer when a thin-film transistor is turned on. Therefore, a larger current may flow between the source and the drain, and the on-state current of the thin-film transistor can be increased. Moreover, the first active layer and the second active layer are respectively disposed above and below the gate, and under the premise that the area of the first active layer is fixed, that is, under the premise that the first active layer has an area the same as that of a single active layer in related technologies, the on-state current of the thin-film transistor can be increased. Therefore, because the area of an active layer does not need to be increased to increase the on-state current of the thin-film transistor, the aperture ratio of a display apparatus is not affected accordingly.

The foregoing are only exemplary embodiments of the present disclosure, and are not intended to limit the present disclosure. Within the spirit and principles of the disclosure, any modifications, equivalent substitutions, improvements, etc., are within the scope of protection of the present disclosure.

What is claimed is:

1. A method of manufacturing a thin-film transistor, comprising:
   forming a first active layer, a source, a drain, and a gate on a substrate, the source, the drain, and the gate being on the first active layer with spacing, and the gate being between the source and the drain in a direction parallel to the substrate; and
   forming a second active layer on the gate, the source, and the drain,
   wherein the source and the drain are both connected to the first active layer and the second active layer, and the gate is respectively insulated from the first active layer, the second active layer, the source, and the drain, and
   wherein forming the first active layer, the source, the drain, and the gate on the substrate comprises:
   forming sequentially the first active layer and a source-drain metal layer on the substrate, and forming a groove on the source-drain metal layer, the depth of the groove being less than the thickness of the source-drain metal layer;
   performing oxidation treatment on the groove bottom and side walls of the groove to form the source, the drain, and a first gate insulating layer, the first gate insulating layer separating the source and the drain;

forming the gate in the groove; and forming a second gate insulating layer on the gate, the second gate insulating layer being located between the source and the drain.

2. The method of manufacturing a thin-film transistor according to claim 1, wherein forming a second gate insulating layer on the gate comprises:

performing oxidation treatment on a surface, away from the substrate, of the gate to form the second gate insulating layer.

3. The method of manufacturing a thin-film transistor according to claim 1, wherein forming a second gate insulating layer on the gate comprises:

forming an insulating material film layer on the gate; and performing patterning treatment on the insulating material film layer to form the second gate insulating layer.

4. The method of manufacturing a thin-film transistor according to claim 1, wherein the second active layer is connected to the first active layer.

5. The method of manufacturing a thin-film transistor according to claim 4, wherein the source and the drain are wrapped in the first active layer and the second active layer.

6. The method of manufacturing a thin-film transistor according to claim 1, wherein at least one of the first gate insulating layer and the second gate insulating layer is formed of a metal oxide.

7. The method of manufacturing a thin-film transistor according to claim 1, wherein the source and the drain are wrapped in the first active layer and the second active layer.

8. The method of manufacturing a thin-film transistor according to claim 1, wherein the first active layer is made of a silicon-based material or a zinc oxide-based material, and the second active layer is made of a silicon-based material or a zinc oxide-based material.

9. The method of manufacturing a thin-film transistor according to claim 1, wherein the thickness of the first active layer is 30 nm to 70 nm, and the thickness of the second active layer is 30 nm to 70 nm.

10. The method of manufacturing a thin-film transistor according to claim 1, wherein the thickness of the source is 200 nm to 400 nm, the thickness of the drain is 200 nm to 400 nm, and the thickness of the gate is 100 nm to 200 nm.

11. The method of manufacturing a thin-film transistor according to claim 1, wherein an orthographic projection of the gate on the first active layer and orthographic projections of the source and the drain on the first active layer do not overlap.

* * * * *